PROCESS FOR FABRICATING VIDICON TUBE TARGET HAVING A HIGH RESISTANCE SPUTTERED SEMI-INSULATING FILM

Original Filed March 13, 1969

INVENTORS:
JOE T. PIERCE
CRAIG P. STEPHENS

United States Patent Office 3,761,375
Patented Sept. 25, 1973

3,761,375

PROCESS FOR FABRICATING VIDICON TUBE TARGET HAVING A HIGH RESISTANCE SPUTTERED SEMI-INSULATING FILM

Joe T. Pierce, Richardson, and Craig P. Stephens, Dallas, Tex., assignors to Texas Instruments Incorporated, Dallas, Tex.

Continuation of abandoned application Ser. No. 806,900, Mar. 13, 1969. This application Jan. 19, 1972, Ser. No. 219,049
Int. Cl. C23c *15/00*
U.S. Cl. 204—192 4 Claims

ABSTRACT OF THE DISCLOSURE

Semiconductor substrates may be coated with a high resistance film by an R.F. sputtering process. The high resistance film is a compound of a ceramic and a metal, e.g. chrome and quartz. Preferably, the high resistance ceramic-metal film is formed in a vacuum chamber with the ceramic wafer supported on a sputtering electrode. A predetermined amount of metal chips are placed on the ceramic wafer and particles of both intimately mix during the sputtering operation. In one application, the high resistance film is deposited over the insulating layer and diode junctions of a vidicon tube target. In this application, the high resistance film functions as a charge carrier path.

This is a continuation of application Ser. No. 806,900, filed Mar. 13, 1969, now abandoned.

This invention relates to charge conduction films, and more particularly to high resistivity ceramic-metal films for temporary charge retardation elements.

Although the invention will be described with respect to a vidicon tube target application, it will be understood that high resistivity films may also be applied to photovoltaic imaging devices, electrostatic optical modulators, charge sensitive phosphorescent displays, or microcircuit resistors.

A number of different electronic cameras have been developed for television and related optical image and other data transmission systems. Of these, the vidicon tube has the inherent advantages of high sensitivity, small size, and simple mechanical construction. One type of vidicon tube utilizes a target consisting of a silicon slice into which an array of p-n junction diodes has been formed. Vidicon tubes of this design utilize the array of discrete p-n junctions to convert an optical image to a stored charge pattern which is periodically scanned and erased by an electron beam. The act of erasing the charge pattern with the electron beam creates the video signal.

A p-n junction target for vidicon tubes is described in U.S. Pat. 3,011,089, entitled "Solid State Light Sensitive Storage Device," issued to F. W. Reynolds on Nov. 28, 1961. Basically, the p-n junction target comprises a semiconductor substrate covered on one side with a thermally grown silicon-dioxide layer. By means of photo masking and etching techniques, an aperture pattern is formed through the silicon-dioxide layer to expose the substrate. The array of p-n junctions is formed through the openings in the silicon-dioxide layer by deposition and diffusion techniques.

One shortcoming with vidicon tube targets fabricated as described in the above patent is that the silicon-dioxide film is highly resistive ($10^{17}$ ohms per square). This high resistance prevents charge conduction from the silicon-dioxide film to the p-n junctions which is essential to the operation of these devices. As a result, the silicon-dioxide layer retains a charged state and poor images are produced. In an effort to overcome the problem of charge retention in the silicon-dioxide layer, a film of antimony-trisulfide was vapor deposited from a thermally heated source onto the silicon-dioxide film. To obtain the proper resistivity for the desired charge conduction, a film 1000 angstroms thick was required. This thick film causes an unacceptable lag in charge conduction and produces poor contrast.

In the fabrication of a vidicon tube, a high temperature "bake-out" is desired to remove impurities from the tube envelope. A film of antimony-trisulfide on a target limits the bake-out to a temperature of less than 150° C. Such a low bake-out temperature adversely affects the tube life. Accordingly, an object of the present invention is to provide a long-life vidicon tube having a p-n junction target.

Another object of this invention is to provide a p-n junction target having an acceptable charge retention characteristic for improved image contrast. A further object of this invention is to provide improved electron beam dwell time for a p-n junction vidicon tube target. Yet another object of this invention is to provide a thin, high resistance film for charge conduction to the p-n junctions of a semiconductor vidicon tuge target. Still another object of this invention is to provide semi-insulators with variable resistivity films for temporary charge retardation. An additional object of this invention is to provide a process for fabricating high resistivity thin films onto semiconductor substrates.

In accordance with this invention, a vidicon tube target of a semiconductor substrate has an array of surface-adjacent p-n junctions formed therein through an insulating layer of silicon-dioxide. A high resistance film of a ceramic-metal compound is sputtered to overlay the surface adjacent p-n junction array and the insulating layer. Preferably, the ceramic-metal compound is a mixture of chrome and quartz having a sheet resistivity on the order of $10^{13}$ ohms per square.

A preferred process for fabricating the high resistance ceramic-metal film includes mounting a ceramic wafer in a vacuum chamber on a sputtering electrode. A predetermined amount of metal chips are placed on the ceramic wafer and the chamber evacuated to the desired pressure. An R.F. signal energizes the sputtering electrode to produce a mixture of ceramic and metal particles that deposit onto a semiconductor substrate to provide temporary charge retardation.

A more complete understanding of the invention and its advantages will be apparent from the specification and claims and from the accompanying drawings illustrative of the invention.

Referring to the drawings.

Figure 1:
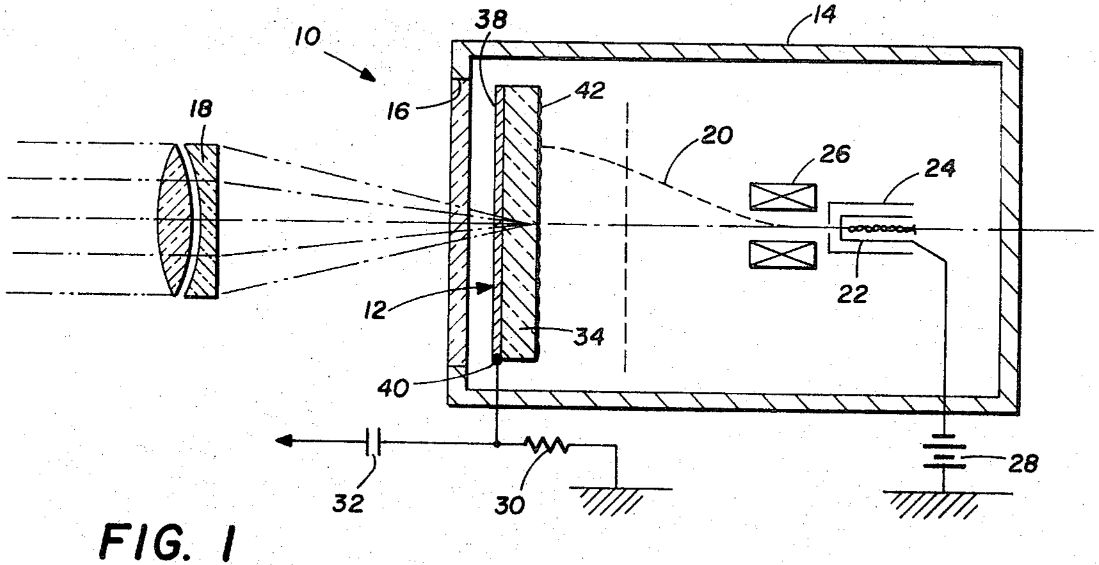
FIG. 1 is a simplified schematic diagram of an electronic camera in accordance with one application of the present invention.

Referring now to the drawings, and in particular to FIG. 1, a video camera in highly simplied form is indicated generally by the reference numeral 10. The video camera 10 is of conventional design except for the optical image storage device 12, commonly referred to as the target. The target 12 is located in an evacuated tube 14. An optical image may be focused on the target 12 through a window 16 by a lens system 18. A low energy electron beam 20 passes from a cathode 22 through an apertured anode 24 and is scanned over the face of the target 12 by a conventional deflection means represented at 26. The cathode 22 is biased by a voltage source 28. Current is produced through a load resistor 30 when the electron beam strikes the target 12 producing a video output signal which is sensed through capacitor 32, as will hereafter be described in greater detail.

The target 12 is fabricated from a monolithic slice of semiconductor material 34. A very large number of very small p-n junctions are formed in the face of the semiconductor material that is subjected to the electron beam 20. Typically, the p-n junctions are 0.0003 inch in diameter and are placed on 0.0008 inch centers giving a total array size of 468,000 junctions in a 0.62 inch by 0.48 inch rectangle. Ohmic contact is made to the semiconductor body 34 by suitable conventional means represented at 40. A thin layer of anti-reflection material 38 may be provided on the other face of the semiconductor body 34.

Operationally, the target 12 produces a signal in the same basic manner as described in the above referenced patent. The target acts as an optical image storage device during each scan cycle of the electron beam 20, which is typically the same as that used in commercial television. Visualize the electron beam 20 scanning the rear portion of the target 12. Since the semiconductor substrate 34 of the target is at a plus DC voltage, the electron beam 20 will deposit electrons at the p-n junctions driving them to cathode potential. Once scanned, each p-n junction diode is reversed biased and will remain so until the depletion layer capacitance, which is a measure of the charge storing capability of the diode, is discharged by light-created minority carriers (holes in this case) or by diode leakage. When light does create the minority carriers in the p-portion, the junction slowly creeps back to the plus DC voltage. The scanning electron beam 20 must then redeposit electrons upon the junction to bring it back to cathode potential. This produces a current through the load resistor 30 proportional to the light incident on the target, thus producing the video output voltage through capacitor 32.

As the electron beam 20 scans over the target 12, charges are also deposited on the insulating layer 42 as well as the individual p-n junctions. Typically, this insulating layer 42 is highly resistive ($10^{17}$ ohms per square) and prevents the charge deposited thereon from conducting to the p-n junctions. In accordance with the present invention, a charge conducting film 44 composed of a mixture of chrome and quartz is R.F. sputtered onto the surface of the semiconductor substrate 34 overlying both the insulating layer 42 and the p-n junctions. The resistivity of the chrome-quartz film 44 is on the order of $10^{13}$ ohms per square, which is a function of the composition and thickness of the film. Now, as the electron beam 20 scans the target 12, charges deposited on the film 44 will migrate to the p-n junctions. In effect, the conductance of the film 44 effectively increases the dwell time of the scanning beam 20 at each p-n junction. The ceramic-metal film 44 also effectively removes excess electrons from the silicon-dioxide surface 42. This allows more complete discharge of the p-n junctions and therefore improves lag and contrast.

Figures 2, 3, 4, 5:
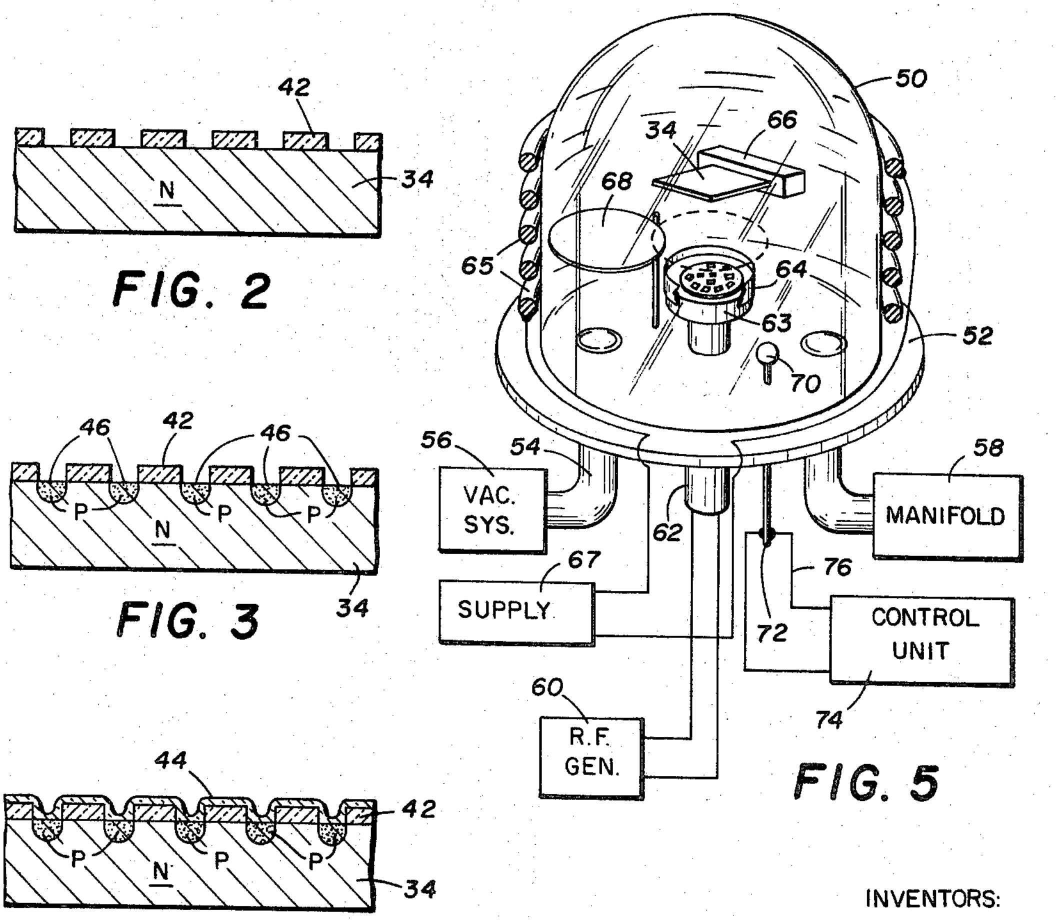
FIGS. 2–4 illustrate the steps in a process for fabricating a p-n junction vidicon tube target.
FIG. 5 is a schematic diagram of a system for forming high resistance ceramic-metal films.

Referring to FIGS. 2, 3 and 4, there is illustrated a section of the target 12 showing the various stages of fabrication. An N-type silicon substrate 34 is initially prepared by properly lapping, polishing and cleaning. Next, the silicon-dioxide layer 42 is thermally grown over one side of the substrate 34. This oxide layer may be grown to a thickness of about 10,000 angstroms on a substrate about 6 mils thick. By using masking and photoresist techniques, an array of holes is etched in the silicon-dioxide layer 42. In addition to providing the pattern for the p-n junctions, the remaining silicon-dioxide provides the necessary insulation between the scanning electron beam 20 and the substrate during operation of the vidicon tube.

Next, a P-type impurity such as boron is deposited on the wafer and diffused into the substrate 34 to a desired depth. All of the several hundred thousand p-n junctions 46 are simultaneously formed in the N-type silicon substrate 34. After the deposition and diffusion of the P-type impurity, the charge conducting ceramic-metal layer 44 is R.F. sputtered over the wafer covering both the silicon-dioxide layer 42 and the array of p-n junctions.

Referring to FIG. 5, there is shown a bell jar system that may be used for fabricating the charge conduction layer 44. A bell jar 50 is in sealing engagement with a base 52 and connected to a vacuum system 56 through a pipe 54. The vacuum system 56 may be of any suitable type, but should be capable of producing vacuums at least as low as $10^{-7}$ torr and include traps and filters for maintaining the bell jar atmosphere within set limits of purity. Any one of several gases may be introduced into the bell jar 50 through a manifold 58 as required for the various processing steps.

An R.F. voltage generator 60 connects to an electrode 62 that extends through the base 52 into the bell jar 50. At the upper end of the electrode 62, there is mounted a circular platform 63 including a ground ring 64 extending slightly above the upper surface of the platform. For R.F. sputtering high resistance layers in accordance with the present invention, the generator 60 should be capable of generating voltages on the order of 5,000 volts. A magnetic field is generated in the bell jar 50 by energizing a magnetic field coil 65. This coil 65 is energized from a supply source 67.

The substrate 34 onto which the high resistance film 44 will be formed is mounted in a holder 66 supported by suitable means (not shown) from the base 52. The substrate 34 is mounted to the holder 66 with the silicon-dioxide layer 42 facing downward toward the electrode 62. A moveable shutter mechanism 68 is rotatably mounted through the base 52 in a manner such that it may be disposed between the electrode 62 and the substrate 34.

A thermocouple pressure gauge 70 is mounted within the bell jar 50 by means of a cable 72 passing through the base 52. The cable 72 couples the gauge 70 to a control unit 74 for controlling the bell jar pressure. The pressure gauge 70 includes a heat source and a temperature sensing element. Heating current is applied by way of conductor 76 to a heater element within the gauge 70. The heat transfer to the thermocouple element of the gauge 70 depends upon the pressure inside the bell jar 50, thus applying a pressure dependent signal to the control unit 74.

In operation of the system of FIG. 5 for forming a high resistance layer on a semiconductor substrate, a ceramic wafer of a high purity is placed on the platform 63. A predetermined amount of high purity metal chips are then distributed over the ceramic wafer. The substrate 34, with the silicon-dioxide layer 42 facing downward, is mounted to the holder 66 and the bell jar 50 evacuated to a pressure on the order of $2 \times 10^{-7}$ torr. Next, the bell jar 50 is back-filled with a gas, e.g. argon, to a pressure on the order of $10^{-2}$ torr. The shutter mechanism 68 is rotated to be disposed between the platform 63 and the substrate 34 and an R.F. voltage supplied to the electrode 62. With the shutter mechanism 68 blocking the substrate 34, the metal chips and ceramic wafer will be sputtered to remove impurities, such as oxide formations. This sputtering will continue for approximately three minutes. In addition to sputtering the metal chips and ceramic wafer, there is also some cleaning action of the substrate 34 by the action of the argon plasma or other ionized back-filling gas.

After the sputtering step has been completed, the shutter mechanism 68 is rotated to the position shown and sputtering of the metal and ceramic begins to form a layer on the substrate 34. The glow discharge initiated by applying a high R.F. voltage to the electrode 62 causes the argon ions produced by the discharge to be accelerated toward the metal chips and ceramic wafer. These argon ions gain sufficient energy to knock atoms (or molecules) from the metal chips and ceramic wafer. Atoms knocked loose from the wafer and metal chips by the impinging ions have sufficient velocity that when they hit the substrate they adhere well. Energetic ions and electrons create nucleation centers on the substrate which also increases adhesion.

As the particles of the metal and ceramic propagate to the substrate 34 they intimately mix to form homogeneous compound. The composition of this compound will be uniform throughout its thickness. This is a result of using a ceramic wafer overlaid wth metal chips. By using a pure ceramic overlaid with a pure metal, the same mixture of metal and ceramic will be produced during the sputtering cycle. Even after the sputtering has proceeded for a considerable length of time, the same mixture of metal and ceramic particles will propagate from the platform of the electrode 62.

The sputtering operation continues until the charge conduction layer 44 is formed on the substrate 34 to a desired thickness. The composition of this layer will be determined by the amount of metal chips placed on the ceramic wafer. In one example, of a vidicon tube target produced by the system of FIG. 5, chrome chips were placed on a quartz wafer. The composition of the resulting charge conduction layer 44 consisted of about 22% by weight of chrome. To produce a resistivity of $10^{13}$ ohms per square, the layer 44 has deposited to a thickness of from 300 to 500 angstroms.

Although only quartz was mentioned as a ceramic and chrome as a metal, other materials may be used. For example, molybdenum or tungsten are other metals. While the invention has been described in the terms of a preferred embodiment, it will be evident that various modifications are possible without departing from the scope of the invention.

What is claimed is:

1. A process for fabricating a vidicon tube target, the process consisting of the steps of:

(a) forming an array of diodes within a semiconductor substrate with at least one terminal of each of said diodes being exposed through openings in an insulating layer which selectively covers said substrate;

(b) selectively positioning a high purity ceramic wafer onto a horizontally oriented wafer-holding platform of a deposition chamber;

(c) selectively positioning a semiconductor substrate vertically above and parallel with said horizontally oriented ceramic wafer;

(d) positioning a predetermined amount of metal chips on a major surface of said ceramic wafer;

(e) evacuating said vacuum chamber to a desired pressure; and (f) R.F. sputtering portions of said ceramic wafer and metal chips as a mixture onto the downwardly facing surface of said substrate to form a homogeneous composite layer essentially consisting of ceramic and metal of substantially uniform thickness, said homogeneous composite layer substantially covering said insulating layer and the exposed terminals of said diodes.

2. The process of fabricating a vidicon tube target of claim 1, and further including the steps of:

(a) masking said substrate from said ceramic wafer and said metal chips oriented thereon; and (b) R.F. sputtering said ceramic wafer and said metal chips to remove surface impurities prior to R.F. sputtering said ceramic and said metal chips as a composite layer onto the downwardly facing surface of said substrate.

3. The process for fabricating a vidicon tube target of claim 1 wherein said ceramic wafer comprises a wafer of quartz, and wherein said metal chips are chromium.

4. A process for fabricating a vidicon tube target, the process consisting of the steps of:

(a) forming an array of diodes within a semiconductor substrate with at least one terminal of each of said diodes being exposed through openings in an insulating layer which selectively covers said substrate;

(b) selectively positioning a high purity ceramic wafer onto a horizontally oriented wafer-holding platform of a deposition chamber;

(c) selectively positioning a semiconductor substrate vertically above and parallel with said horizontally oriented ceramic wafer;

(d) positioning a predetermined amount of metal chips on a major surface of said ceramic wafer;

(e) positioning a mask vertically between said semiconductor substrate and said ceramic wafer and metal chips;

(f) removing impurities from the surface of said ceramic wafer and metal chips by R.F. sputtering;

(g) removing said mask from vertical orientation between said substrate and said ceramic wafer and metal chips; and (h) R.F. sputtering portions of said ceramic wafer and metal chips as a mixture onto the downwardly facing surface of said substrate to form a homogeneous composite layer essentially consisting of ceramic and metal of substantially uniform thickness, said homogeneous composite layer substantially covering said insulating layer and the exposed terminals of said diodes.

References Cited

UNITED STATES PATENTS

| | | | |
|---|---|---|---|
| 3,481,854 | 12/1969 | Lane | 204—192 |
| 3,477,935 | 11/1969 | Hall | 204—192 |
| 3,507,766 | 4/1970 | Cunningham et al. | 204—192 |
| 3,347,772 | 10/1967 | Laegreid et al. | 204—192 |
| 3,254,970 | 6/1966 | Dittrich et al. | 29—195 |
| 3,395,030 | 7/1965 | Dittrich | 117—105 |
| 3,400,066 | 9/1968 | Caswell et al. | 204—192 |

OTHER REFERENCES

Archey et al.: "Powder Sputtering," IBM Tec. Dis. Bul., vol. 9, No. 12, May 1967.

Michalak: "Low Energy Sputtering of Resistive Films," Vacuum, vol. 17, No. 6, March 1, 1967.

JOHN H. MACK, Primary Examiner

S. S. KANTER, Assistant Examiner

U.S. Cl. X.R.

204—298; 313—65 AB, 66; 317—234 S